US009954051B2

(12) United States Patent
See et al.

(10) Patent No.: US 9,954,051 B2
(45) Date of Patent: Apr. 24, 2018

(54) STRUCTURE AND METHOD OF FABRICATING THREE-DIMENSIONAL (3D) METAL-INSULATOR-METAL (MIM) CAPACITOR AND RESISTOR IN SEMI-ADDITIVE PLATING METAL WIRING

(71) Applicants: Guan Huei See, Singapore (SG); Chin Hock Toh, Singapore (SG); Glen T. Mori, Gilroy, CA (US); Arvind Sundarrajan, Singapore (SG)

(72) Inventors: Guan Huei See, Singapore (SG); Chin Hock Toh, Singapore (SG); Glen T. Mori, Gilroy, CA (US); Arvind Sundarrajan, Singapore (SG)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 15/288,594

(22) Filed: Oct. 7, 2016

(65) Prior Publication Data
US 2017/0104056 A1    Apr. 13, 2017

Related U.S. Application Data

(60) Provisional application No. 62/240,277, filed on Oct. 12, 2015.

(51) Int. Cl.
*H01L 21/768*    (2006.01)
*H01L 21/02*    (2006.01)
(Continued)

(52) U.S. Cl.
CPC .......... *H01L 28/60* (2013.01); *H01L 21/0217* (2013.01); *H01L 21/02181* (2013.01);
(Continued)

(58) Field of Classification Search
CPC ... H01L 28/60; H01L 28/20; H01L 21/02183; H01L 21/02181; H01L 21/0217;
(Continued)

(56) References Cited

U.S. PATENT DOCUMENTS 7,759,768 B2 * 7/2010 Barth .................. H01L 23/5223
257/528
9,324,780 B2 * 4/2016 Jen .......................... H01L 28/60
(Continued)

OTHER PUBLICATIONS

International Search Report and Written Opinion dated Jan. 23, 2017 for PCT Application No. PCT/US2016/056621.

*Primary Examiner* — Dao H Nguyen
(74) *Attorney, Agent, or Firm* — Moser Taboada; Alan Taboada

(57) ABSTRACT

Methods of processing a substrate include: providing a substrate having a polymer dielectric layer, a metal pad formed within the polymer dielectric layer and a first metal layer formed atop the polymer dielectric layer; depositing a polymer layer atop the substrate; patterning the polymer layer to form a plurality of openings, wherein the plurality of openings comprises a first opening formed proximate the metal pad; depositing a first barrier layer atop the polymer layer; depositing a dielectric layer atop the first barrier layer; etching the dielectric layer and the first barrier layer from within the first opening and a field region of the polymer layer; depositing a second barrier layer atop the substrate; depositing a second metal layer atop the substrate wherein the second metal layer fills the plurality of openings; and etching the second metal layer from a portion of the field region of the polymer layer.

21 Claims, 7 Drawing Sheets

(51) Int. Cl.
  *H01L 23/522* (2006.01)
  *H01L 23/532* (2006.01)
  *H01L 49/02* (2006.01)
  *H01L 21/311* (2006.01)
  *H01L 21/3213* (2006.01)

(52) U.S. Cl.
  CPC .. *H01L 21/02183* (2013.01); *H01L 21/31105* (2013.01); *H01L 21/31127* (2013.01); *H01L 21/32133* (2013.01); *H01L 21/76802* (2013.01); *H01L 21/76831* (2013.01); *H01L 21/76846* (2013.01); *H01L 21/76877* (2013.01); *H01L 23/5223* (2013.01); *H01L 23/5228* (2013.01); *H01L 23/5329* (2013.01); *H01L 23/53223* (2013.01); *H01L 23/53238* (2013.01); *H01L 28/20* (2013.01)

(58) Field of Classification Search
  CPC ......... H01L 21/76846; H01L 21/76831; H01L 21/76802; H01L 21/76877; H01L 21/32133; H01L 21/31127; H01L 21/31105; H01L 23/5228; H01L 23/5223; H01L 23/5329; H01L 23/53238; H01L 23/53223

USPC .......... 438/17, 381, 540, 694; 257/532, 735, 257/737, 738, 780, E21.008, E21.531, 257/E21.508, E23.02, E23.021, E29.342
  See application file for complete search history.

(56) References Cited

U.S. PATENT DOCUMENTS

| | | | |
|---|---|---|---|
| 9,490,203 B2* | 11/2016 | Tsai | H01L 23/48 |
| 2002/0037643 A1* | 3/2002 | Ishimaru | H01L 23/5256 |
| | | | 438/642 |
| 2003/0201476 A1 | 10/2003 | Cheng et al. | |
| 2010/0203655 A1* | 8/2010 | Ayotte | H01L 22/34 |
| | | | 438/17 |
| 2012/0112314 A1* | 5/2012 | Jou | H01L 23/5223 |
| | | | 257/532 |
| 2013/0168816 A1 | 7/2013 | Kang et al. | |
| 2013/0241939 A1 | 9/2013 | Lasiter et al. | |
| 2014/0264624 A1 | 9/2014 | Yen et al. | |
| 2014/0264743 A1 | 9/2014 | Yen et al. | |

* cited by examiner

STRUCTURE AND METHOD OF FABRICATING THREE-DIMENSIONAL (3D) METAL-INSULATOR-METAL (MIM) CAPACITOR AND RESISTOR IN SEMI-ADDITIVE PLATING METAL WIRING

CROSS-REFERENCE TO RELATED APPLICATIONS

This application claims benefit of U.S. provisional patent application Ser. No. 62/240,277, filed Oct. 12, 2015, which is herein incorporated by reference.

FIELD

Embodiments of the present disclosure generally relate to three-dimensional metal-insulator-metal ("3D MIM") capacitors and resistors in integrated circuits.

BACKGROUND

A semiconductor memory device generally comprises a plurality of memory cells which are used to store a large quantity of information. Each memory cell includes a capacitor for storing electric charge and a corresponding field effect transistor for opening and closing charging and discharging passages of the capacitor. As the size of semiconductor devices continues to shrink, the area occupied by each component of a semiconductor device should be decreased. Capacitors are one component that can occupy considerable area on a semiconductor die depending on the size of the capacitor and/or the number of capacitors on the die.

One example of a capacitor used in a semiconductor memory device is a metal-insulator-metal (MIM) capacitor. A traditional MIM capacitor is two-dimensional (2D). A 2D MIM capacitor has two facing metal plates which are planar and substantially parallel to each other and to the substrate. One method of increasing the capacitance of a MIM capacitor is to increase the sizes of the metal plates. However, increasing the sizes of the metal plates will consume more surface area of the substrate. Accordingly, a need exists to reduce the surface area on the substrate occupied by a capacitor without sacrificing the capacitance.

Accordingly, the inventors have developed an improved 3-dimensional metal-insulator-metal (3D MIM) capacitor and method of forming a 3D MIM capacitor.

SUMMARY

Methods for processing a substrate are provided herein. In some embodiments, a method of processing a substrate includes: providing a substrate having a polymer dielectric layer, a metal pad formed within the polymer dielectric layer and a first metal layer formed atop the polymer dielectric layer; depositing a polymer layer atop the substrate; patterning the polymer layer to form a plurality of openings to a top surface of the first metal layer, wherein the plurality of openings comprises a first opening formed proximate the metal pad; depositing a first barrier layer atop the polymer layer and within the plurality of openings formed in the polymer layer; depositing a dielectric layer atop the first barrier layer and within the plurality of openings formed in the polymer layer; etching the dielectric layer and the first barrier layer from within the first opening and a field region of the polymer layer; depositing a second barrier layer atop the substrate; depositing a second metal layer atop the substrate wherein the second metal layer fills the plurality of openings; and etching the second metal layer from a portion of the field region of the polymer layer.

In some embodiments, a method of processing a substrate, includes: providing a substrate having a patterned polymer dielectric layer comprising a plurality of openings; depositing a first barrier layer atop the substrate; depositing a dielectric layer atop the first barrier layer; depositing a second barrier layer atop the dielectric layer; and depositing a metal pad atop a portion of a field region of the patterned polymer dielectric layer.

A substrate includes: a polymer dielectric layer; a metal pad filling an opening in the polymer dielectric layer; a patterned first metal layer atop the polymer dielectric layer and conductively coupled to the metal pad; a polymer layer atop the substrate, wherein the polymer layer comprises a plurality of openings etched to a top surface of the patterned first metal layer, wherein the plurality of openings comprises a first opening formed proximate the metal pad; a barrier layer atop the polymer layer and within the plurality of openings in the polymer layer; a dielectric layer atop the barrier layer and within the plurality of openings in the polymer layer; a second barrier layer atop the substrate; and a second metal layer atop the substrate wherein the second metal layer fills the plurality of openings, and wherein the barrier layer, the dielectric layer and the second metal layer are not formed atop a portion of a field region of the substrate.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

Figure 1:
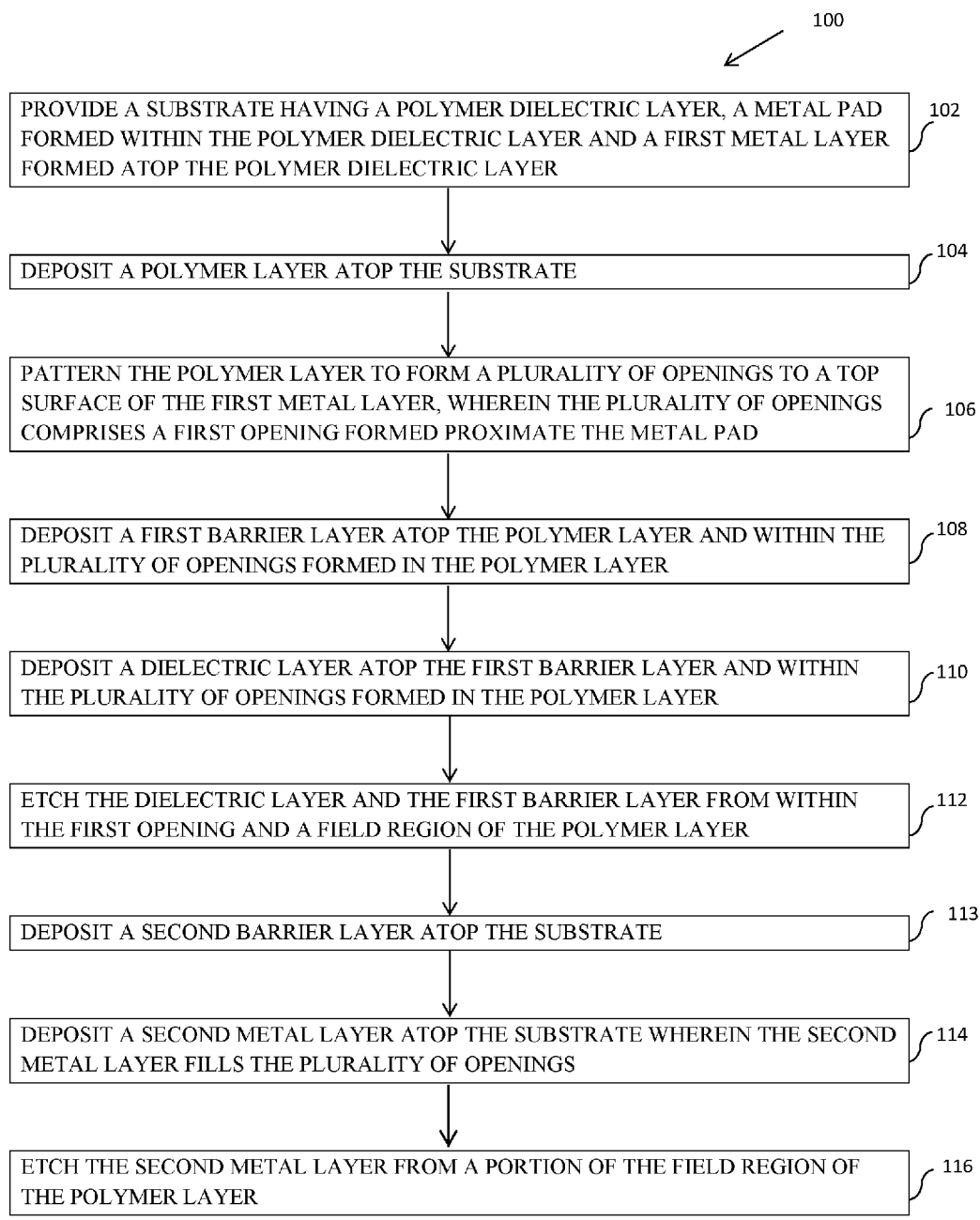
FIG. 1 depicts a flow chart of a method for processing a substrate in accordance with some embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Methods for processing a substrate are provided herein. The inventive methods advantageously facilitate an improved 3-dimensional (3D) metal-insulator-metal (MIM) capacitor and method of forming a 3D MIM capacitor having reduced resistance, enhanced system performance of overall system (i.e. of die connection to pad), and enhanced surface area over the same footprint in view of traditional 2-dimensional MIM structures.

FIG. 1 depicts a flow chart of a method 100 for processing a substrate in accordance with some embodiments of the present disclosure. The method 100 is described herein with respect to the structure depicted in FIGS. 2A-2G. The method 100 of the present disclosure may be performed in a single process chamber capable of performing both etching and deposition. Such a suitable process chamber may be a standalone process chamber, or part of a cluster tool. Alternatively, the inventive methods disclosed herein may be performed in separate chambers that also may be standalone or part of a cluster tool.

Figure 2A:
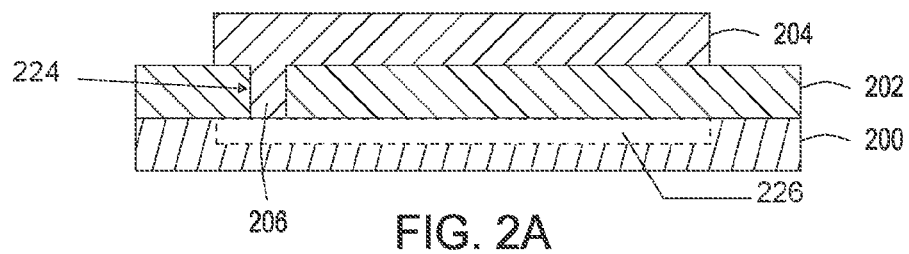
FIGS. 2A-G depict the stages of processing a substrate in accordance with some embodiments of the present disclosure.

The method 100 generally begins at 102, as depicted in FIG. 2A, by providing a substrate 200 having a polymer dielectric layer 202, a metal pad 206 formed within the polymer dielectric layer 202 and a first metal layer 204 formed atop the polymer dielectric layer 202. The metal pad 206 is formed within an opening 224 in the polymer dielectric layer 202. In some embodiments, the metal pad 206 fills the opening 224 to a top surface of the substrate 200. In some embodiments, a die 226 is optionally embedded in the substrate 200. The die can be any known suitable die material, such as silicon, used in wafer packaging. The substrate 200 may be any suitable substrate material used in semiconductor manufacturing processes. For example, the substrate 200 may be one of silicon, glass, ceramic, or dielectric. The polymer dielectric layer 202 may comprise any suitable polymer dielectric material such as polyimide or polybenzoxazole, or the like. The metal pad 206 and the first metal layer 204 may comprise any suitable conductive material used to form a metal interconnect such as copper (Cu), aluminum (Al), or the like. The first metal layer 204 is a redistribution layer (i.e. a layer to redirect connectivity to the pad) provided over the polymer dielectric layer 202. In some embodiments, the first metal layer 204 may be formed using a plating process or deposition process, such as a physical vapor deposition process, used in a semiconductor manufacturing processes.

Figure 2B:
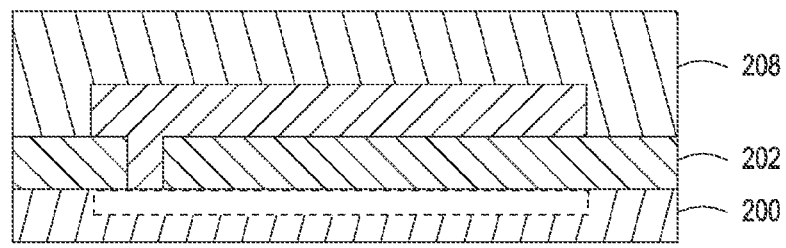
Figure 2C:
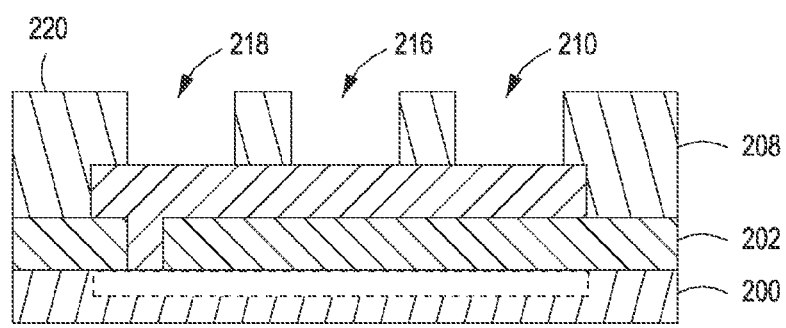

Next at 104, and as depicted in FIG. 2B, a polymer layer 208 is spin-coated over the substrate 200. The polymer layer 208 may be deposited using any suitable spin-coating process or lithographic process. In some embodiments, the polymer layer 208 is a polybenzoxazole (PBO) layer, a polyimide layer, a benzocyclobutene (BCB) layer, an epoxy layer, or a photo-sensitive material layer Next, at 106, and as depicted in FIG. 2C, the polymer layer 208 is patterned to form a plurality of openings 210. The plurality of openings 210 are formed to a top surface 216 of the first metal layer 204. The plurality of openings 210 comprises a first opening 218 formed proximate the metal pad 206. In some embodiments, the patterning process may be any suitable lithographic process for forming openings in the polymer layer 208. In some embodiments, the plurality of openings 210 may be a feature such as a via, a trench, or the like.

Figure 2D:
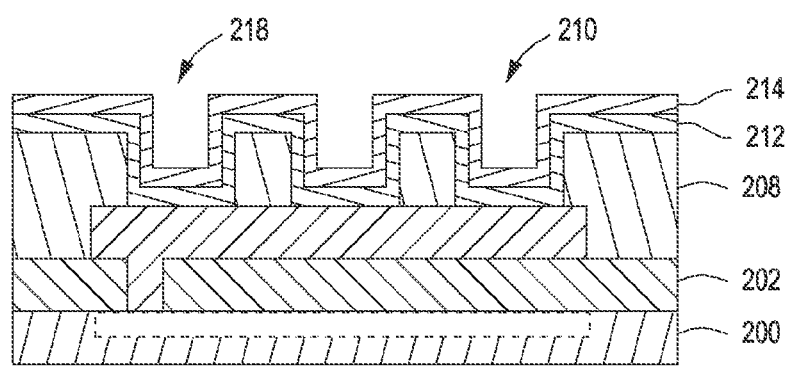

Next at 108, and as depicted in FIG. 2D, a first barrier layer 212 is conformally deposited atop the substrate 200. The first barrier layer 212 is deposited atop, or directly atop, the polymer layer 208 and within the plurality of openings 210 formed in the polymer layer 208. The first barrier layer 212 is deposited atop the field region of the polymer layer 208 and along the sidewalls of the plurality of openings 210 and the bottom of the plurality of openings 210. The first barrier layer 212 may be deposited using any suitable deposition process, for example a physical vapor deposition process (PVD), a chemical vapor deposition process (CVD), an atomic layer deposition process (ALD), or the like. In some embodiments, the first barrier layer 212 is a conductive material, such as titanium (Ti) or titanium nitride (TiN).

Next, at 110, and as depicted in FIG. 2D, a dielectric layer 214 is conformally deposited over the first barrier layer 212. The dielectric layer 214 is deposited atop, or directly atop, the first barrier layer 212 and within the plurality of openings 210 formed in the polymer layer 208. The dielectric layer 214 is deposited atop the field region of the first barrier layer 212 and along the sidewalls of the plurality of openings 210 and the bottom of the plurality of openings 210. The dielectric layer 214 may be deposited using any suitable deposition process, for example a physical vapor deposition process (PVD), a chemical vapor deposition process (CVD), an atomic layer deposition process (ALD), or the like. In some embodiments, the dielectric layer 214 is a nitride film or a high-k dielectric material, such as hafnium oxide ($HfO_2$), silicon nitride ($Si_3N_4$), or tantalum oxide ($Ta_2O_5$).

Figure 2E:
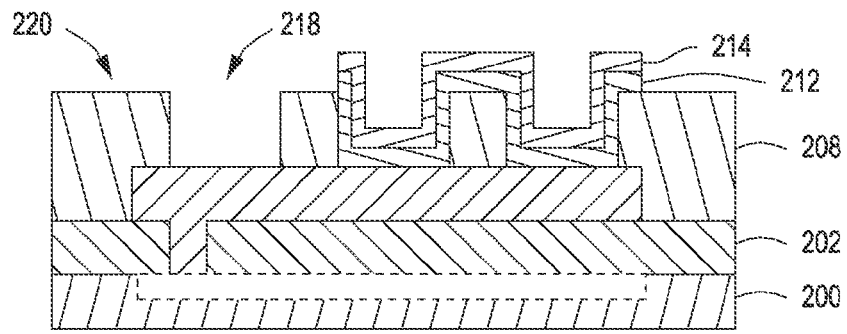

Next, at 112, and as depicted in FIG. 2E, the dielectric layer 214 and the first barrier layer 212 are etched from within the first opening 218 and from a field region 220 of the polymer layer 208. In some embodiments, the dielectric layer 214 and the first barrier layer 212 may be etched using a patterned photoresist layer (not shown). For example, a photoresist material can be deposited on the substrate 200 and then exposed to light filtered by a reticle, such as a glass plate that is patterned with exemplary feature geometries that block light from propagating through the reticle. After passing through the reticle, the light contacts the surface of the photoresist material and changes the chemical composition of the photoresist material such that a developer can remove a portion of the photoresist material. In the case of positive photoresist materials, the exposed regions are removed, and in the case of negative photoresist materials, the unexposed regions are removed. The photoresist layer may comprise any photoresist materials suitable to provide a template to facilitate etching the layers 212, 214 from within the first opening 218 and from a field region 220 of the polymer layer 208. For example, in some embodiments, the photoresist material may be a positive or negative photoresist and/or a DUV or EUV (deep ultraviolet or extreme ultraviolet) photoresist and may comprise one or more of polymers, organic compounds (e.g., comprising carbon, hydrogen and oxygen), an amorphous carbon, such as Advanced Patterning Film (APF), available from Applied Materials, Inc., located in Santa Clara, Calif., a tri-layer resist (e.g., a photoresist layer, a Si-rich anti-reflective coating (ARC) layer, and a carbon-rich ARC, or bottom ARC (BARC) layer), a spin-on hardmask (SOH), or the like. Thereafter, the layers 212, 214 are etched to remove the material from the areas that are no longer protected by the photoresist material. The photoresist material is then completely stripped from the substrate 200.

Figure 2F:
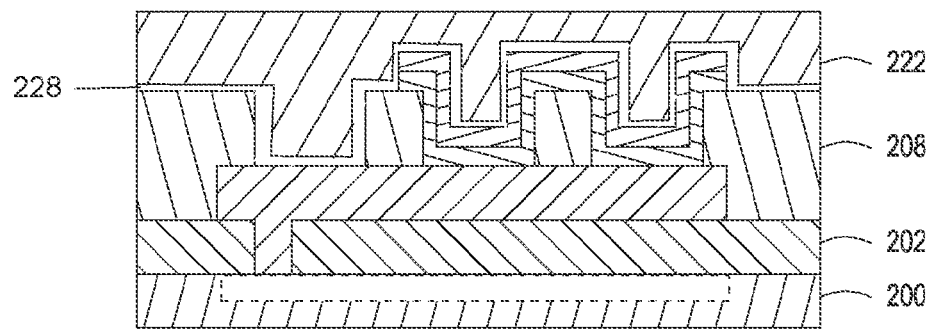

Next, at 113 and 114, and as depicted in FIG. 2F, a second barrier layer 228 and a second metal layer 222, are deposited atop the substrate 200. The second barrier layer 228 is conformally deposited atop the substrate 200 and within the plurality of openings 210 formed in the polymer layer 208. The second barrier layer 228 may be deposited using any suitable deposition process, for example a physical vapor deposition process (PVD), a chemical vapor deposition process (CVD), an atomic layer deposition process (ALD), or the like. In some embodiments, the second barrier layer 228 is a conductive material, such as titanium (Ti) or titanium nitride (TiN). The second metal layer 222 is deposited atop the substrate 200 and fills the plurality of openings 210. The second metal layer 222 may be deposited using any suitable deposition process, for example a electroplating process. The second metal layer 222 may comprise any suitable conductive material used to form a metal interconnect such as copper (Cu), aluminum (Al), or the like.

Figure 2G:
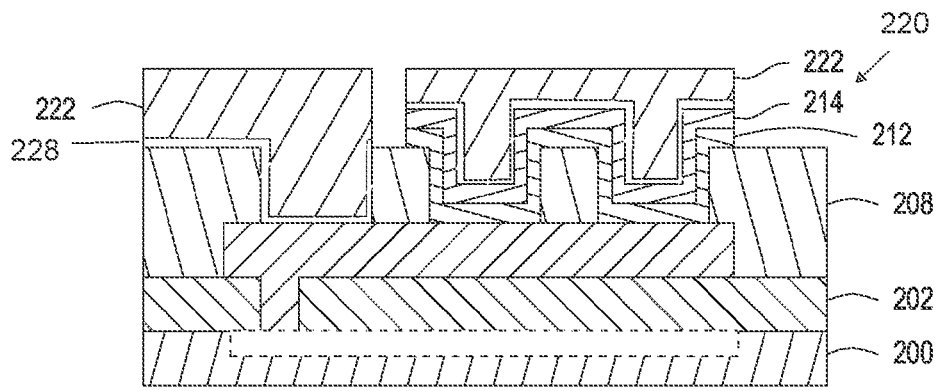

Next, at 116, and depicted in FIG. 2G, the layers 212, 214, 228, 222 are etched from a portion of the field region 220 of the polymer layer 208. In some embodiments, the layers 212, 214, 228, 222 may be etched using a patterned photoresist layer (not shown) as described above. The photoresist layer may comprise any photoresist materials suitable to provide a template to facilitate etching the layers 212, 214, 228, 222. The layers 212, 214, 228, 222 are etched to remove the material from the areas that are no longer protected by the photoresist material. The photoresist material is then completely stripped from the substrate 200.

Figure 3A:
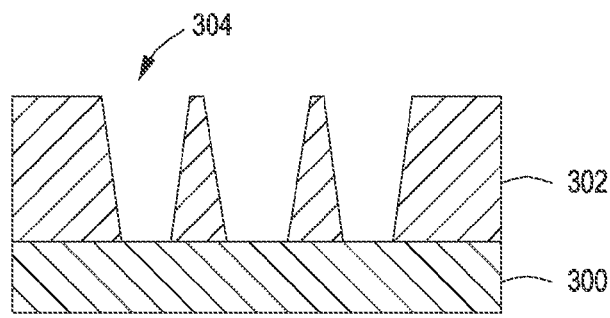
FIGS. 3A-3G depict embodiments of forming a 3-dimensional resistor in accordance with some embodiments of the present disclosure.
Figure 3B:
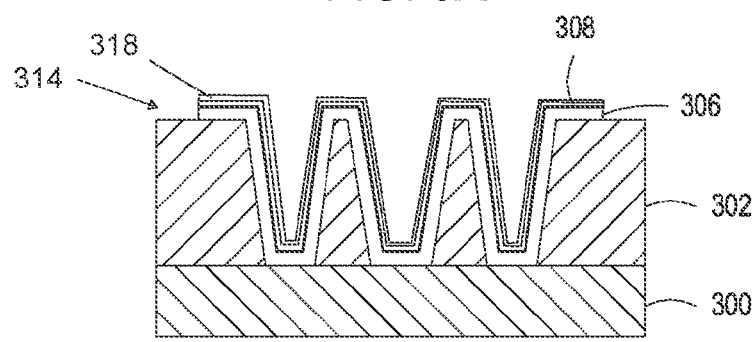
Figure 3C:
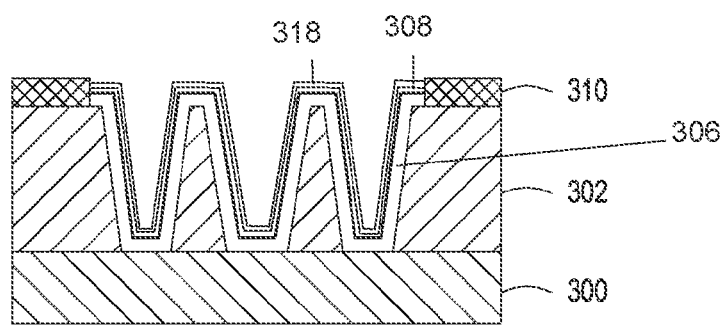
Figure 4:
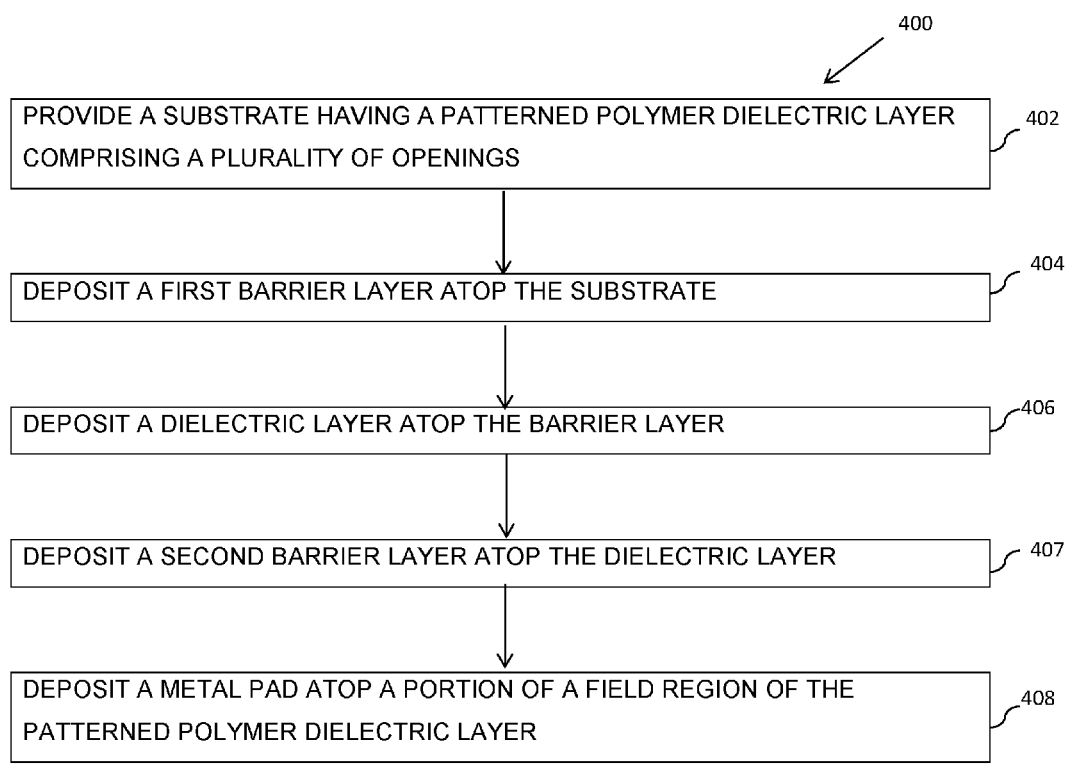
FIG. 4 depicts a flow chart of a method for processing a substrate in accordance with some embodiments of the present disclosure.

FIG. 4 depicts a flow chart of a method 400 for processing a substrate in accordance with some embodiments of the present disclosure. The method 400 is described herein with respect to the structure depicted in FIGS. 3A-3C. The method 400 of the present disclosure may be performed in a single process chamber capable of performing both etching and deposition. Such a suitable process chamber may be a standalone process chamber, or part of a cluster tool. Alternatively, the inventive methods disclosed herein may be performed in separate chambers that also may be standalone or part of a cluster tool.

FIGS. 3A-3C depicts one embodiment of forming a 3-dimensional resistor in accordance with some embodiments of the present disclosure. The method 400 generally begins at 402, as depicted in FIG. 3A by providing a substrate 300 having a patterned polymer dielectric layer 302 comprising a plurality of openings 304. In some embodiments, the substrate 300 may be any suitable substrate material used in semiconductor manufacturing processes. For example, the substrate 300 may be one of silicon, glass, ceramic, or dielectric. The patterned polymer dielectric layer 302 may comprise any suitable polymer dielectric material such as polyimide or polybenzoxazole, or the like. In some embodiments, the patterned polymer dielectric layer 302 may be patterned using any suitable etch lithographic process, such as a plasma etching process, for forming openings in a polymer material.

Next, at 404, and as depicted in FIG. 3B a first barrier layer 306 is deposited atop the substrate 300. The first barrier layer 306 is deposited atop the patterned polymer dielectric layer 302 and within the plurality of openings 304 formed in the patterned polymer dielectric layer 302. The first barrier layer 306 is deposited atop the field region of the patterned polymer dielectric layer 302 and along the sidewalls of the plurality of openings 304 and the bottom of the plurality of openings 304. The first barrier layer 306 may be deposited using any suitable deposition process, for example a physical vapor deposition process (PVD), a chemical vapor deposition process (CVD), an atomic layer deposition process (ALD), or the like. In some embodiments, the first barrier layer 306 is a conductive material, such as titanium (Ti) or titanium nitride (TiN).

Next, at 406, and as depicted in FIG. 3C, a dielectric layer 308 is deposited over the first barrier layer 306. The dielectric layer 308 is deposited atop the first barrier layer 306 and within the plurality of openings 304 formed in the patterned polymer dielectric layer 302. The dielectric layer 308 may be deposited using any suitable deposition process, for example a physical vapor deposition process (PVD), a chemical vapor deposition process (CVD), an atomic layer deposition process (ALD), or the like. In some embodiments, the dielectric layer 308 is a nitride film or a high-k dielectric material, such as hafnium oxide ($HfO_2$), silicon nitride ($Si_3N_4$), tantalum oxide ($Ta_2O_5$).

Next, at 407, following deposition of the dielectric layer 308 a second barrier layer 318 is conformally deposited atop the substrate 200, for example directly atop the dielectric layer 308, and within the plurality of openings 210 formed in the polymer layer 208. The second barrier layer 318 may be deposited using any suitable deposition process, for example a physical vapor deposition process (PVD), a chemical vapor deposition process (CVD), an atomic layer deposition process (ALD), or the like. In some embodiments, the second barrier layer is a conductive material, such as titanium (Ti) or titanium nitride (TiN). Next, the layers 306, 308, 318 are etched from a portion of the field region 314 of the patterned polymer dielectric layer 302. In some embodiments, the layers 306, 308, 318 may be etched using a patterned photoresist layer (not shown) as described above.

Next at 408, and as depicted in FIG. 3C a metal pad 310 connection is formed atop a portion of the field region of the patterned polymer dielectric layer 302. The metal pad 310 may comprise any suitable conductive material used to form a metal interconnect such as copper (Cu).

Figure 5:
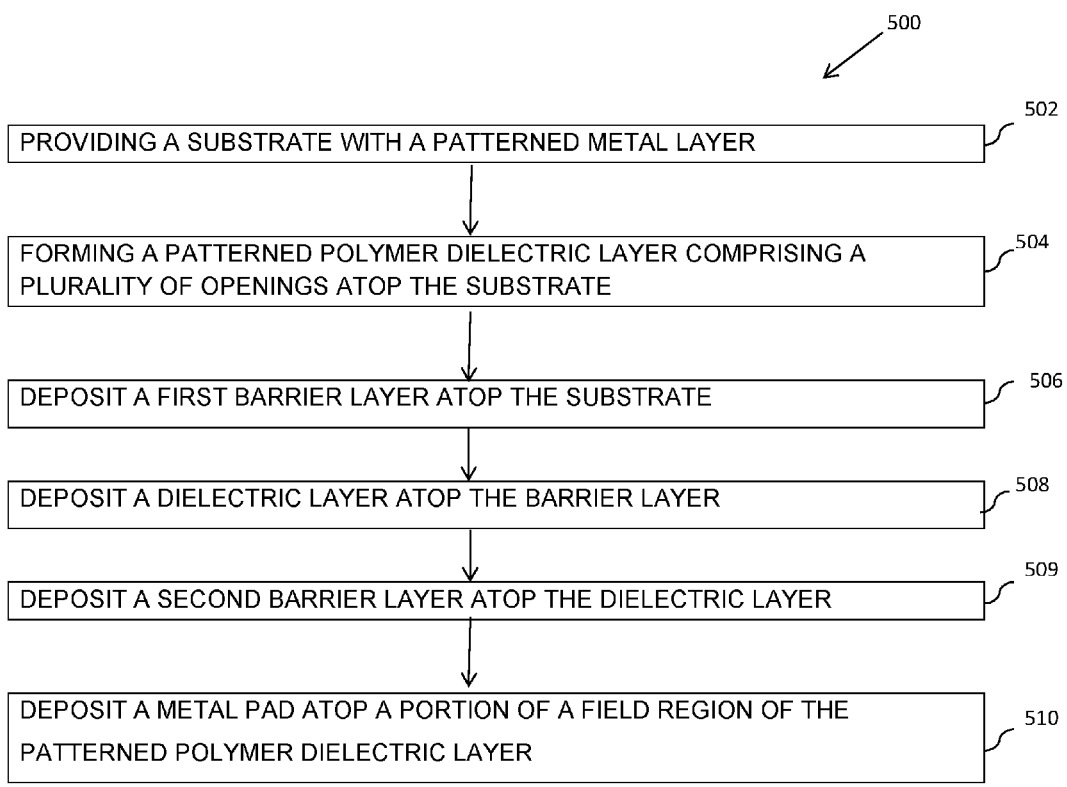
FIG. 5 depicts a flow chart of a method for processing a substrate in accordance with some embodiments of the present disclosure.

FIG. 5 depicts a flow chart of a method 500 for processing a substrate in accordance with some embodiments of the present disclosure. The method 500 is described herein with respect to the structure depicted in FIGS. 3D-3G. The method 500 of the present disclosure may be performed in a single process chamber capable of performing both etching and deposition. Such a suitable process chamber may be a standalone process chamber, or part of a cluster tool. Alternatively, the inventive methods disclosed herein may be performed in separate chambers that also may be standalone or part of a cluster tool.

Figure 3D:
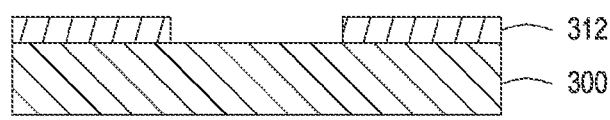

FIGS. 3D-3G depict one embodiment of forming a 3-dimensional resistor in accordance with some embodiments of the present disclosure. The method 500 generally begins at 502, and as depicted in FIG. 3D by providing a substrate 300 with a patterned metal layer 312. In some embodiments, the substrate 300 may be any suitable substrate material used in semiconductor manufacturing processes. For example, the substrate 300 may be one of silicon, glass, ceramic, or dielectric. In some embodiments, the patterned metal layer 312 may comprise any suitable conductive material used to form a metal interconnect such as copper (Cu).

Figure 3E:
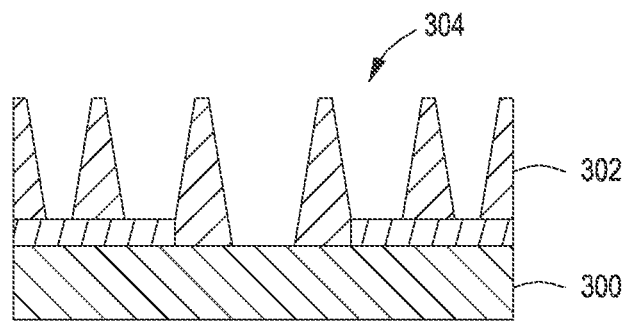

Next, at 504, and as depicted in FIG. 3E, a patterned polymer dielectric layer 302 comprising a plurality of openings 304 is formed atop the substrate 300. A portion of the plurality of openings 304 is formed atop the patterned metal layer 312 such that a portion of the plurality of openings 304 exposes a top surface of the patterned metal layer 312. The patterned polymer dielectric layer 302 may comprise any suitable polymer dielectric material such as polyimide or polybenzoxazole, or the like. In some embodiments, the patterned polymer dielectric layer 302 may be patterned using any suitable etch lithographic process, such as a plasma etching process, for forming openings in a polymer material.

Figure 3F:
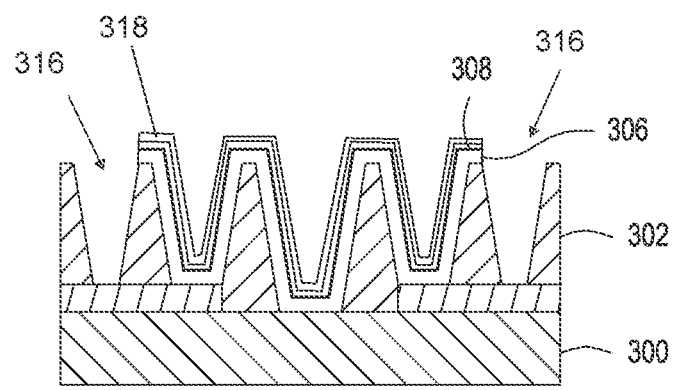

Next, at 506, and as depicted in FIG. 3F a first barrier layer 306 is deposited atop the substrate 300. The first barrier layer 306 is deposited atop the patterned polymer dielectric layer 302 and within the plurality of openings 304 formed in the patterned polymer dielectric layer 302. The first barrier layer 306 is deposited atop the field region of the patterned polymer dielectric layer 302 and along the sidewalls of the plurality of openings 304 and the bottom of the plurality of openings 304. The first barrier layer 306 may be deposited using any suitable deposition process, for example a physical vapor deposition process (PVD), a chemical vapor deposition process (CVD), an atomic layer deposition process (ALD), or the like. In some embodiments, the first barrier layer 306 is a conductive material, such as titanium (Ti) or titanium nitride (TiN).

Next, at 508, and as depicted in FIG. 3F, a dielectric layer 308 is deposited over the first barrier layer 306. The dielectric layer 308 is deposited atop the first barrier layer 306 and within the plurality of openings 304 formed in the patterned polymer dielectric layer 302. The dielectric layer 308 may be deposited using any suitable deposition process, for example a physical vapor deposition process (PVD), a chemical vapor deposition process (CVD), an atomic layer deposition process (ALD), or the like. In some embodiments, the dielectric layer 308 is a nitride film or a high-k dielectric material, such as hafnium oxide ($HfO_2$), silicon nitride ($Si_3N_4$), tantalum oxide ($Ta_2O_5$). The dielectric layer 308 and the first barrier layer 306 are then removed from within a first opening 316 of the patterned polymer dielectric layer 302. In some embodiments, the layers 306, 308, may be etched from within a first opening 316 of the patterned polymer dielectric layer 302 using a patterned photoresist layer (not shown) as described above.

Following deposition of the dielectric layer 308 a second barrier layer 318 is conformally deposited atop the substrate 200 and within the plurality of openings 304 formed in the patterned polymer dielectric layer 302. The second barrier layer 318 may be deposited using any suitable deposition process, for example a physical vapor deposition process (PVD), a chemical vapor deposition process (CVD), an atomic layer deposition process (ALD), or the like. In some embodiments, the second barrier layer is a conductive material, such as titanium (Ti) or titanium nitride (TiN). Next, the layers 306, 308, 318 are etched from within a first opening 316 of the patterned polymer dielectric layer 302 using a patterned photoresist layer (not shown) as described above.

Figure 3G:
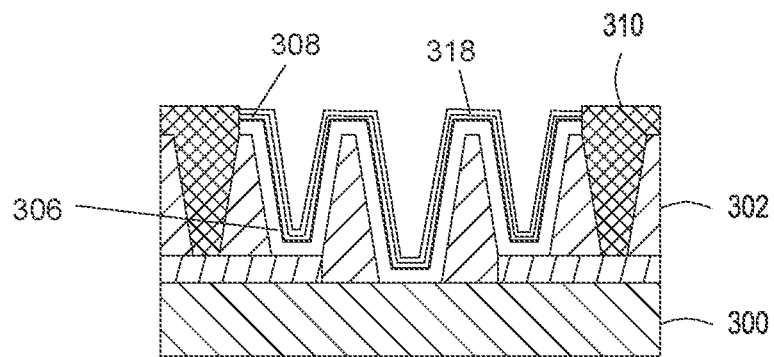

Next at 510, and as depicted in FIG. 3G, a metal pad 310 connection is formed to the patterned metal layer 312. The metal pad 310 is formed atop a portion of the field region of the patterned polymer dielectric layer 302. The metal pad 310 may comprise any suitable conductive material used to form a metal interconnect such as copper (Cu). The conductive material of the metal pad 310 is deposited within the first opening 316 of the patterned polymer dielectric layer 302 to fill the first opening 316.

While the foregoing is directed to embodiments of the present disclosure, other and further embodiments of the disclosure may be devised without departing from the basic scope thereof.

The invention claimed is:

1. A method of processing a substrate, comprising:
providing a substrate having a polymer dielectric layer, a metal pad formed within the polymer dielectric layer and a first metal layer formed atop the polymer dielectric layer;
depositing a polymer layer atop the substrate;
patterning the polymer layer to form a plurality of openings to a top surface of the first metal layer, wherein the plurality of openings comprises a first opening formed proximate the metal pad;
depositing a first barrier layer atop the polymer layer and within the plurality of openings formed in the polymer layer;
depositing a dielectric layer atop the first barrier layer and within the plurality of openings formed in the polymer layer;
etching the dielectric layer and the first barrier layer from within the first opening and a field region of the polymer layer;
depositing a second barrier layer atop the substrate;
depositing a second metal layer atop the substrate wherein the second metal layer fills the plurality of openings; and
etching the second metal layer from a portion of the field region of the polymer layer.

2. The method of claim 1, wherein the substrate is one of silicon, glass, ceramic, or dielectric.

3. The method of claim 1, wherein the metal pad is copper.

4. The method of claim 1, wherein the first metal layer is titanium.

5. The method of claim 1, wherein the polymer dielectric layer is polyimide or polybenzoxazole.

6. The method of claim 1, wherein the polymer layer is one of a polybenzoxazole (PBO) layer, a polyimide layer, a benzocyclobutene (BCB) layer, an epoxy layer, or a photo-sensitive material layer.

7. The method of claim 1, wherein the first barrier layer is titanium nitride (TiN).

8. The method of claim 1, wherein the second metal layer is a copper or aluminum layer.

9. The method of claim 1, wherein the dielectric layer is hafnium oxide ($HfO_2$), silicon nitride ($Si_3N_4$), or tantalum oxide ($Ta_2O_5$).

10. A method of processing a substrate, comprising:
providing a substrate having a patterned polymer dielectric layer comprising a plurality of openings;
depositing a first barrier layer atop the patterned polymer dielectric layer and within the plurality of openings;
depositing a dielectric layer atop the first barrier layer;
depositing a second barrier layer atop the dielectric layer; and
depositing a metal pad atop a portion of a field region of the patterned polymer dielectric layer.

11. The method of claim 10, wherein the substrate is one of silicon, glass, ceramic, or dielectric.

12. The method of claim 10, wherein the metal pad is copper.

13. The method of claim 10, wherein the patterned polymer dielectric layer is one of a polybenzoxazole (PBO) layer, a polyimide layer, a benzocyclobutene (BCB) layer, an epoxy layer, or a photo-sensitive material layer.

14. The method of claim 10, wherein at least one of the first barrier layer or the second barrier layer is titanium or titanium nitride (TiN).

15. The method of claim 10, wherein the dielectric layer is one of hafnium oxide ($HfO_2$), silicon nitride ($Si_3N_4$), or tantalum oxide ($Ta_2O_5$).

16. The method of claim 10, further comprising:
etching the first barrier layer, the dielectric layer, and the second barrier layer from the portion of the field region of the patterned polymer dielectric layer prior to depositing the metal pad atop the portion of the field region.

17. A substrate, comprising:
a polymer dielectric layer;
a metal pad filling an opening in the polymer dielectric layer;

a patterned first metal layer atop the polymer dielectric layer and conductively coupled to the metal pad;

a polymer layer atop the substrate, wherein the polymer layer comprises a plurality of openings etched to a top surface of the patterned first metal layer, wherein the plurality of openings comprises a first opening formed proximate the metal pad;

a barrier layer atop the polymer layer and within the plurality of openings in the polymer layer;

a dielectric layer atop the barrier layer and within the plurality of openings in the polymer layer;

a second barrier layer atop the substrate; and a second metal layer atop the substrate wherein the second metal layer fills the plurality of openings, and wherein the barrier layer, the dielectric layer and the second metal layer are not formed atop a portion of a field region of the substrate.

18. The substrate of claim 17, wherein the polymer dielectric layer is polyimide or polybenzoxazole.

19. The substrate of claim 17, wherein the polymer layer is one of a polybenzoxazole (PBO) layer, a polyimide layer, a benzocyclobutene (BCB) layer, an epoxy layer, or a photo-sensitive material layer.

20. The substrate of claim 17, wherein the second metal layer is a copper or aluminum layer.

21. The substrate of claim 17, wherein the dielectric layer is hafnium oxide ($HfO_2$), silicon nitride ($Si_3N_4$), or tantalum oxide ($Ta_2O_5$).

* * * * *